United States Patent [19]

Ashley et al.

[11] Patent Number: 4,926,228
[45] Date of Patent: May 15, 1990

[54] PHOTOCONDUCTIVE DETECTOR ARRANGED FOR BIAS FIELD CONCENTRATION AT THE OUTPUT BIAS CONTACT

[75] Inventors: Timothy Ashley; Charles T. Elliott; Anthony M. White, all of Malvern, England

[73] Assignee: Secretary of State for Defence (G.B.), England

[21] Appl. No.: 811,304

[22] Filed: Dec. 16, 1985

Related U.S. Application Data

[63] Continuation of Ser. No. 658,461, Oct. 9, 1984, which is a continuation of Ser. No. 361,482, Mar. 24, 1982, abandoned.

[30] Foreign Application Priority Data

Mar. 30, 1981 [GB] United Kingdom ............... 8109928

[51] Int. Cl.$^5$ .......................................... H01L 27/14
[52] U.S. Cl. ......................................... 357/30; 357/55; 357/68; 250/334; 250/370.01
[58] Field of Search .................... 357/30, 30 D, 30 H, 357/30 J, 55, 68; 250/334, 370

[56] References Cited

U.S. PATENT DOCUMENTS

| | | | |
|---|---|---|---|
| 2,239,693 | 4/1941 | Bennett | 313/351 X |
| 2,252,694 | 8/1941 | Bennett | 313/351 X |
| 2,713,132 | 7/1955 | Matthews et al. | 357/55 X |
| 2,790,089 | 4/1957 | Pelfrey | 357/68 X |
| 2,792,538 | 5/1957 | Pfann | 357/55 X |
| 2,842,724 | 7/1958 | Thedieck | 357/55 |
| 2,882,465 | 4/1959 | MacDonald | 357/68 |
| 2,979,427 | 4/1961 | Shockley | 357/55 X |
| 3,110,806 | 11/1963 | Denney et al. | 357/30 X |
| 3,167,663 | 1/1965 | Melngailus et al. | 357/55 X |
| 3,457,633 | 7/1969 | Marinace et al. | 357/55 X |
| 3,558,889 | 1/1971 | Chang et al. | 357/3 X |
| 3,581,151 | 5/1971 | Boyle et al. | 357/15 |
| 3,593,071 | 7/1971 | Janning | 357/68 X |
| 3,626,217 | 12/1971 | Sandbank et al. | 357/30 X |
| 3,660,733 | 5/1972 | Vilf et al. | 357/1 X |
| 3,805,125 | 4/1974 | Sterzer | 357/55 X |
| 3,995,159 | 11/1976 | Elliott | 250/370 |
| 4,101,351 | 7/1978 | Shah et al. | 357/55 X |
| 4,221,047 | 9/1980 | Narken et al. | 357/68 X |
| 4,231,052 | 10/1980 | Day et al. | 357/30 X |
| 4,231,053 | 10/1980 | Schoolar | 357/30 |
| 4,516,148 | 5/1985 | Barth | 357/55 X |

FOREIGN PATENT DOCUMENTS

1365804  9/1974  United Kingdom .

OTHER PUBLICATIONS

Basigico et al., "Ion—Implanted Buried Finger Photodiode", *IBM Technical Disclosure Bulletin*, vol. 21, No. 9, Feb., 1979, p. 3580.
"Handbook on Semiconductors", vol. 4, Chapter 6B entitled "Infrared Detectors", by C. T. Elliott, pp. 727-798 (1981).
"Semiconductors and Semimetals", by R. K. Willardson and Albert C. Beer, vol. 18, 1981, Mercury Cadmium Telluride, pp. 157-159.
"Optical and Infrared Detectors", Topics in Applied Physics, vol. 19, by R.J. Keyes, 1980.
Infrared Detectors, by C. T. Elliott, Chapter 6B, 1981, pp. 729-735.

*Primary Examiner*—William Mintel
*Attorney, Agent, or Firm*—Cushman, Darby & Cushman

[57] ABSTRACT

A detector, of photosensitive semiconductor material with input and output bias contacts. To improve both frequency response and spatial resolution, minority carriers having tendency to accumulate in the vicinity of the output bias contact are instead rapidly swept out, being driven towards this contact by a concentrated electric field. To produce a local field concentration, the output bias contact may be extended towards the input bias contact, or the detector material near this contact may be configured by slotting or tapering.

7 Claims, 2 Drawing Sheets

PHOTOCONDUCTIVE DETECTOR ARRANGED FOR BIAS FIELD CONCENTRATION AT THE OUTPUT BIAS CONTACT

This is a continuation of application Ser. No. 658,461, filed Oct. 9, 1984, which was abandoned upon the filing hereof and which was a continuation of application Ser. No. 361,482, filed Mar. 9, 1982, now abandoned.

TECHNICAL FIELD

This invention concerns a photoconductive detector—that is to say a device of photosensitive semiconductor material having an input bias contact and an output bias contact. Such a device may also include one or more additional contacts—eg a voltage contact or voltage contacts—to facilitate radiation detection.

BACKGROUND ART

Many photoconductive detectors now use the material Cadmium Mercury Telluride (CMT) as the photosensitive semiconductor material and have contacts of gold, indium, or aluminium metal. See for example UK Patent No. 1,488,258 (U.S. Pat. No. 3,995,159). Conventionally, photoconductive detectors have a rectilinear geometry—ie the semiconductor material is provided in square or rectangular shape and the contacts are provided at the ends of the material and are patterned each with an orthogonal straight edge boundary between the metal and the semiconductor material. Some detectors—particularly those incorporated in integrated arrays, may be provided with contacts not of metal but of heavy doped semiconductor material—i.e., contact, may be formed at the interface between light doped or intrinsic photosensitive semiconductor material and regions of heavy doped conductive material—so-called "light-heavy" (l-h) contacts.

Photoconductive infra-red detectors of CMT material, particularly of the high purity CMT material now available, have the property of long excess carrier (ie photocarrier) lifetime. Typical bulk lifetimes are between 1 to 4 $\mu$s (8 to 14 $\mu$m band sensitive CMT material and between 10 and 20 $\mu$s (3 to 5 $\mu$m sensitive CMT material). This makes detectors particular susceptible to accumulation effects. The devices, in the absence of accumulation effects would normally be operated in a sweep-out condition—where the effective excess minority carrier lifetime is determined by the transit time of minority carriers through the device, which is very much less than the bulk lifetime—thus the delayed recombination of excess carriers at the contact, ie accumulation, results in an increased effective lifetime. [The phenomenon of carrier accumulation in semiconductors was first suggested by Low (Proc Phys Soc Lond B68, 310 (1955)) and the theory has been developed by Gunn (Jnl Electronics & Control 4, 17 (1958)].

Carrier accumulation has two consequences for detector performance. Firstly, the detector responsivity (this is defined as the voltage (or equivalent voltage) output corresponding to a radiation flux of 1 watt on the detector, or in the case of three lead structures eg Patent No. 1,488,258, a radiation flux of 1 watt per detector width squared) is increased. This follows because the time spent by excess carriers in the detector is increased, i.e., the sweep-out time is lengthened. Secondly, however, the frequency response of the detector is degraded. For the detector described in UK Patent No. 1,488,258, this latter consequence is manifest as a degradation of the spatial resolution afforded by the detector.

DISCLOSURE OF THE INVENTION

The invention is intended to provide high responsivity as a result of accumulation without the penalty of degraded frequency response or spatial resolution. It has now been discovered that the accumulation time for carriers in the immediate vicinity of the output bias contact—ie the contact towards which the photocarriers are caused to flow, can be reduced significantly provided that the driving field, immediately local to the output bias contact, is increased. The responsivity remains high since the accumulated photogenerated carriers despite their reduced storage time, modulate the conductivity in an enhanced field region. The basis of the detector structures described below is to use the accumulation effect in contact region geometries such that the local electric field is high, thereby gaining the advantage of increased responsivity without penalty of significantly degraded frequency response or spatial resolution.

According to one form of the invention the detector is characterised by an output bias contact of pronounced lengthwise extent, this contact extending towards the input bias contact, being shaped such as to concentrate electric field in the immediate vicinity of the output bias contact.

Preferably the output bias contact is arranged in position relative to the sides of the photosensitive semiconductor material such as to concentrate the electric field symmetrically. This arrangement is provided to minimise the transit time spread of photocarriers incident on the output bias contact.

If the detector is of n-type material the output bias contact will be negatively biassed, and conversely if the detector is of p-type material the output bias contact will be positively biassed.

According to another form of the invention the detector is characterised by an output bias contact region wherein the detector material is configured in the immediate vicinity of the output bias contact such as to concentrate electric field towards the output bias contact. In this form of the invention the detector material may be relieved by one or more slots extending transverse to the length of the material. Preferably the detector material is relieved by a pair of opposite slots extending one from either side of the detector. Preferably the slots are in abutment with the output bias contact. Alternatively, the material of the detector may be profiled in the immediate vicinity of the output bias contact so as to concentrate the electric field towards the output bias contact.

The detector may combine both the above features, having both a shaped output bias contact and a configured output region.

BRIEF DESCRIPTION OF THE DRAWINGS

Particular embodiments of the invention will now be described, for the purpose of example only, with reference to the accompanying drawings of which.

DESCRIPTION OF THE EMBODIMENTS

Figure 1:
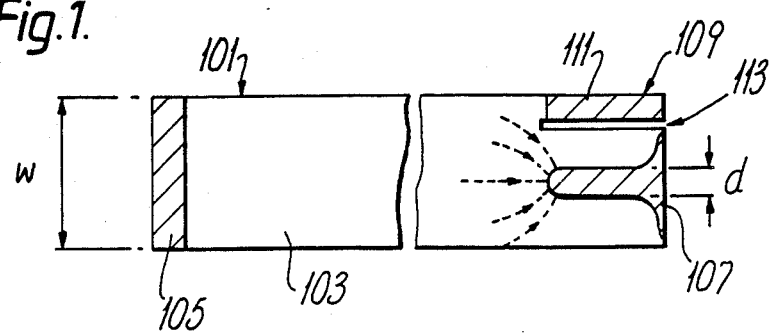
FIG. 1: is a plan view of a photoconductive detector provided with a shaped output bias contact.

There is shown in FIG. 1 a photoconductive detector 101 comprising a strip filament 103 of n-type Cadmium Mercury Telluride material, about 700 μm in length and 62.5 μm wide (w). The electron density is between $5 \times 10^{14}$ to $1 \times 10^{15}$ cm$^{-3}$. The material has the composition $Cd_{0.2}Hg_{0.8}Te$ and is sensitive to infra-red radiation in the 8 to 14 μm band of the spectrum. At cryogenic temperatures ~80° K., it is characterised by a photocarrier bulk lifetime of between 1 and 4 μs when incorporated in a nitrogen temperature, F-3 cold shield. The strip 103 is mounted on a sapphire insulating substrate (not shown) and is cut to shape by ion beam milling of an oversize CMT slice. Gold metal contacts 105 and 107 are formed at each end of the strip 103 by sputtering metal to form a film over the surface of the strip 103 and these are patterned photolithographically. At one end of the strip 103, the material is bifurcated, providing a voltage contact spur 109. This spur 109 has a gold mejtal contact 111 on its upper surface. This has also been formed during the sputtering-photolithographic etch process. The bifurcating channel-slot 113, between the spur 109 and the end region of the detector strip 103, has been formed by ion beam milling and is approximately 12 μm wide. At the bifurcated end of the strip 103 the gold metal contact 107, the output bias contact, has been shaped to introduce a local distortion of electrical field in the strip 103, a field that is produced when bias is applied to the two bias contacts 105 and 107. The output bias contact 107 has, as shown, a pronounced lengthwise extent, it projects from the bifurcated end of the strip in the direction of the input bias contact 105. It is in the form of a metal finger about 50 μm long and 15 μm wide (d) and is centered between the sides of the end region of the strip 103. The finger contact 107 has a smooth contour, it has no sharp corners. This ensures regular distortion of the field, and furthermore, since in any case it proves difficult to produce sharp cornered metal patterns, it is all the more reproducible.

For this geometry of detector the field E at the contact is estimated to be:

$$E \simeq (W/d)E_0 \simeq 120 \text{ V cm}^{-1}$$

where $E_0$, the field in the major part of the device, is around 30 Vcm$^{-1}$ under typical operating conditions. The field is concentrated about four-fold.

The frequency response for this detector can be estimated from the recombination velocity S for the contact—typically 1000 cm s$^{-1}$ to 500 cm s$^{-1}$. Considering a line of radiation incident on the detector, the output pulse produced by this radiation would decay to 1/eth of its value in a time T:

$$T \simeq 0.7 \times 10^{-7} \text{ secs } (S = 1000 \text{ cm s}^{-1})$$

$$T \simeq 1.2 \times 10^{-7} \text{ secs } (S = 500 \text{ cm s}^{-1})$$

This assumes that the only source of pulse broadening is carrier accumulation. (In fact the broadening will in the present case then be dominated by thermal diffusion of the carriers.) Where the detector is employed in a scanned imaging system (see UK Patent No. 1,488,258) this broadening of the response will correspond to a limitation of the spatial resolution. Thus for an image scan velocity of 130 m/s, a typical value, the notional resolution is calculated as:

8 μm for S = 1000 cm s$^{-1}$ and
14 μm for S = 500 cm s$^{-1}$

This limit of the spatial resolution is insignificant compared with that typical for thermal diffusion which in the device described would be around 50 μm.

The responsivity (R) of the detector is increased by the accumulation effect. The contribution by the accumulation effect only is estimated as:

$$R_{ACC} \simeq \frac{D\eta\phi_s\tau E}{SNt}$$

where "D" is the carrier diffusion coefficient, "E" is the field at the contact, "N" the equilibrium electron density and $\phi_s$ the photon flux corresponding to 1 watt-/width$^2$ of signal radiation (11 μm wavelength). Taking typical values for the lifetime $\tau \simeq 2$ μs, and detector thickness t=8 μm, quantum efficiency $\eta = 1$, recombination velocity S=1000 cm s$^{-1}$, N=$1 \times 10^{15}$ cm$^{-3}$, E=120 V cm$^{-1}$:

$$R_{ACC}(11 \text{ μm}) \simeq 1.3 \times 10^6 \text{ Vw}^{-1}$$

This responsivity is a factor ~6 times that achieved using a conventional output contact.

Figure 2:
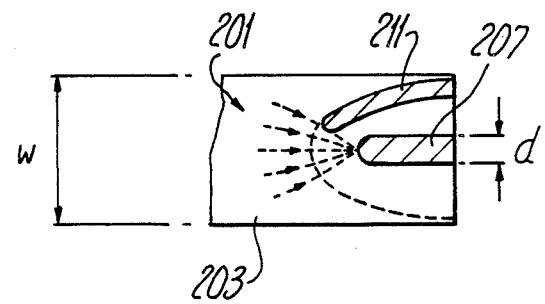
FIG. 2: is a plan view of another photoconductive detector, shown in part only, provided with a shaped output bias contact and having a different read-out geometry.

The detector 201, the end part of which is shown in FIG. 2, has a modified read-out region at the end of the photoconductive strip 203. As in the example of FIG. 1, it has an elongate contact finger 207 providing the output bias contact. However, a voltage contact 211 is provided adjacent this finger 207. In the region nearest the tip of the finger contact 207 the voltage contact conforms to the contour of an "undisturbed" voltage equipotential (ie an equipotential calculated for the detector without the voltage contact present). In this case the field pattern in the vicinity of the output bias contact 207 is then relatively unperturbed.

Figure 3:
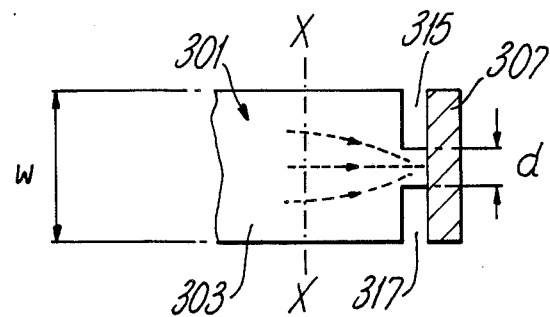
FIG. 3: is a plan view of an alternative photoconductive detector shown in part only, provided with a pair of slots in the vicinity of the output bias contact.

The detector 301 shown in FIG. 3 is of alternative construction. The strip 303 is configured in the vicinity of the output bias contact 307. Part of the photosensitive semiconductor material has been removed by ion beam milling to produce two opposed slots 315 and 317. The width of the detector strip 303 is thus constricted and when bias is applied to the bias contacts, the field is distorted in the immediate vicinity of the output bias contact. The width of the constriction is ≃10 μm. The slots 315 and 317 are of like length and width and serve to distort the field in a symmetrical manner. Carriers, drifting towards the contact 307 from a region of the strip 303 where the field is reasonably uniform—eg from the line X—X shown in FIG. 3, will arrive at the bias contact 307 with a spread of arrival times. The symmetry introduced ensures that this spread is minimal. The slots 315 and 317 abut the contact 307. They may however be displaced from the contact 307, but any spacing should be small compared to the width of the constriction "d" for otherwise the performance would be impoverished.

Figure 4:
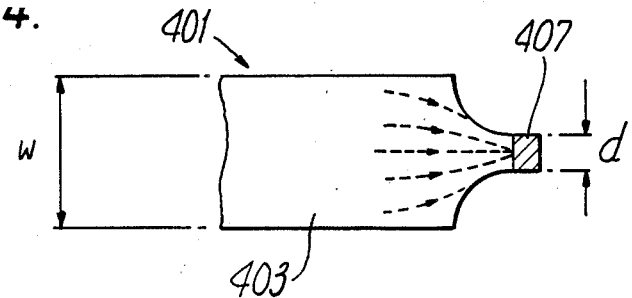
FIG. 4: is a plan view of another alternative photoconductive detector, shown in part only, the output bias contact region of which is profiled.

A further alternative is shown in FIG. 4. The detector 401 is profiled at the end of the strip 403. The width of the strip 403 changes gradually as the output bias contact 407 is neared. The profiling is symmetrical to minimise the spread of carrier transit time.

Figure 5:
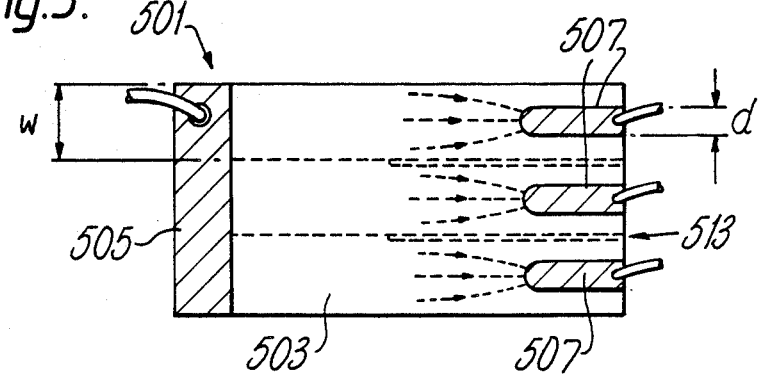
FIG. 5: is a plan view of a photoconductive detector array provided with a plurality of shaped output bias contacts; and, FIG. 6: is a plan view of a photoconductive detector of annular configuration.

A fast high responsivity discrete array detector is shown in FIG. 5. This detector 501 comprises a slice 503 of CMT material or other n-type photosensitive semiconductor material. A common input bias contact metallisation 505 is formed at the end of the slice. Several output bias contacts 507—three are shown—are provided at the other end of the slice 503. Each of the bias contacts 507 is formed as a metal finger about 10 $\mu$m wide (d) and with a centre-to-centre pitch between neighbours of around 50 $\mu$m. This distance is comparable to about twice the lifetime limited diffusion spread of carriers in CMT (8 to 14 $\mu$m material). The detector 501 is thus effectively divided into tracks each about 50 $\mu$m wide (W). However, these tracks may be delineated if desired by introducing slots 513 between the contacts 507.

For this detector 501 the responsivity due to accumulation is estimated as:

$$R_{ACC} \approx \frac{4D}{\pi CS} R_0$$

where $R_0$ is the sweep-out limited responsivity of a conventional detector:

$$R_0 \approx (2E_\lambda \mu_p N t)^{-1}$$

where $E_\lambda$ is the photon energy, $\mu_p$ the hole mobility. Values are given in Table 1 below:

| Material | S(cms$^{-1}$) | 4D/($\pi$CS) | $\tau$ACC ($\times 10^{-7}$ secs) |
|---|---|---|---|
| CMT 8–14 $\mu$m band | 1000 | 3.8 | 0.7 |
|  | 500 | 7.6 | 1.2 |
| CMT 3–5 $\mu$m band | 500 | 5.6 | 2.5 |
|  | 250 | 11.2 | 4.4 |

Figure 6:
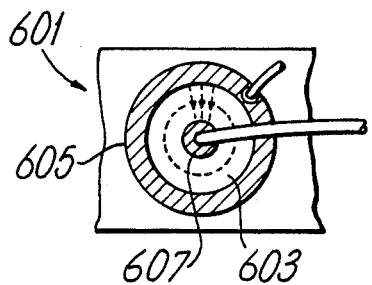

An alternative fast high responsivity detector is shown in FIG. 6. This detector 601 comprises a slice 603 of photosensitive semiconductor material. An annular ring metal conductor 605 provides an input bias contact. At the centre of the ring contact 605, an output bias contact, a circular disc conductor 607, is provided. The electric field, produced when bias is applied to the contacts 605 and 607, has cylindrical symmetry and converges in the direction of the output contact 607. An insulating layer may be provided over the detector 601 to facilitate access to the output bias contact 607. Access would then be provided through a window in the insulating layer. The improvement in responsivity may be assessed by comparing the responsivity of this annular structure with the responsivity of a conventional rectilinear geometry detector of width W:

$$\frac{R_{ACC}(\text{annular})}{R_{ACC}(\text{rectangular})} \approx \frac{W}{2\pi r_1} = 1.6$$

where W=50 $\mu$m, and the radius of the output bias contract $r_1$=5 $\mu$m. This assumes the same material, doping and thickness, and full sweep-out.

The detectors described in the above examples may be used in imaging applications. As is conventional, they may be cooled, and located, either singly or in array, at the image plane of a shielded optical assembly. The image focussed by this assembly may be either static or scanned, the assembly in the latter case including rotating mirrors or flapping mirrors, or both, to scan the image across each detector.

Using two-contact detectors, signal information may be derived by measuring bias current (at constant bias voltage) or by measuring the voltage between bias contacts (at constant bias current). Detectors, including in addition one or more voltage contacts, may also be used, voltage between voltage contacts or between a voltage contact and the output bias contact (at constant bias current) being measured.

Having described the invention, We claim:

1. In a photoconductive detector of the kind having:
   (1) a strip filament of semiconductor material of single conductivity type with a surface region transverse to its thickness dimension arranged for receiving radiation from a scene, and
   (2) an input bias electrode and an output bias electrode forming Ohmic contacts to said filament and defining a bias current path in the filament transverse to said thickness dimension, the improvement comprising:
   said output bias electrode being formed at least partly as a finger contacting and extending over part of said surface region towards said input bias electrode as appropriate to effect bias field concentration in the immediate vicinity of and bias current convergence on the output bias electrode with consequent enhanced responsivity without greatly degrading frequency response; said output bias electrode finger having two edges substantially parallel to two edges of said surface region; and said finger edges being equispaced from respective surface region side edges as appropriate to provide symmetrical bias field concentration.

2. In a photoconductive detector of the kind having:
   (1) a strip filament of semiconductor material of single conductivity type with a surface region transverse to its thickness dimension arranged for receiving radiation from a scene, and
   (2) an input bias electrode and an output bias electrode forming Ohmic contacts to said filament and defining a bias current path in the filament transverse to said thickness dimension, the improvement comprising:
   said output bias electrode being formed at least partly as a finger contacting and extending over part of said surface region towards said input bias electrode as appropriate to effect bias field concentration in the immediate vicinity of and bias current convergence on the output bias electrode with consequent enhanced responsivity without greatly degrading frequency response; said output bias electrode finger having two edges substantially parallel to two edges of said surface region; and said strip filament having a slot extending substantially parallel to and between one of said finger edges and one of said surface region edges.

3. In a photoconductive detector of the kind having:
   (1) a strip filament of semiconductor material of single conductivity type with a surface region transverse to its thickness dimension arranged for receiving radiation from a scene, and (2) an input bias electrode and an output bias electrode forming Ohmic contacts to said filament and defining a bias current path in the filament transverse to said thickness dimension, the improvement comprising: said output bias electrode being formed at least partly as a finger contacting and extending over part of said surface region towards said input bias electrode as appropriate to effect bias field concentration in the immediate vicinity of and bias current convergence on the output bias electrode with consequent enhanced responsivity without greatly degrading frequency response; and including a voltage contact arranged on said surface region and contacting it along a path which would correspond to an equipotential with respect to the output bias contact in the absence of said voltage contact.

4. A photoconductive detector according to claim 2 including a voltage contact arranged on said strip filament between said slot and surface region edge.

5. In a photoconductive detector of the kind having:
(1) a sheet of semiconductor material of single conductivity type with a surface region transverse to its thickness dimension arranged for receiving radiation from a scene, and
(2) biasing means comprising Ohmic contacts to said sheet arranged for establishing a bias current direction transverse to said thickness dimension,
the improvement comprising: said Ohmic contacts being arranged as an input bias contact to bias a first side of said sheet and a plurality of output bias contacts arranged to bias a second side of the sheet remote from the first side, said output bias contacts being arranged as separate fingers contacting and extending over said surface region towards said input bias electrode as appropriate to effect bias field concentration in the immediate vicinity of and bias current convergence on each of said fingers with consequent enhanced responsivity without greatly degrading frequency response.

6. A photoconductive detector according to claim 5 including slots between said fingers extending towards said input bias electrode as appropriate to delineate a respective bias current path to each finger.

7. In a photoconductive detector of the kind having:
(1) a strip filament of semiconductor material of single conductivity type with a surface region transverse to its thickness dimension arranged for receiving radiation from a remote scene, and
(2) an input bias electrode and an output bias electrode forming Ohmic contacts to said filament and defining a bias current path in the filament transverse to said thickness dimension,
the improvement comprising: the filament cross-section being reduced immediatelly adjacent said output bias electrode to constrict said bias current path producing bias field concentration in the immediate vicinity of and bias current convergence on the output bias electrode with consequent enhanced responsivity without greatly degrading frequency response.

8. A photoconductive detector according to claim 7 wherein said filament is notched to reduce its cross-section immediately adjacent said output bias electrode.

9. A photoconductive detector according to claim 7 wherein said filament has a tapering reduction in cross-section immediately adjacent to said output bias electrode.

10. In a photoconductive detector of the kind having a semiconductor material element of single conductivity type with a surface arranged to receive radiation from a remote scene and bearing both an input bias electrode and an output bias electrode forming Ohmic contacts thereto,
the improvement comprising: the input bias electrode being annular and the output bias electrode being a spot arranged centrally thereof as appropriate to establish a radial bias field concentrating towards and bias current converging on the output bias electrode with consequent enhanced responsivity without greatly degrading frequency response.

11. A method of detecting electromagnetic radiation including the steps of:
(1) arranging a photoconductive detector to receive radiation from a scene, the detector having:
(a) a strip filament of semiconductor material of single conductivity type with a surface region transverse to its thickness dimension for receiving said radiation, and
(b) an input bias electrode and and an output bias electrode forming Ohmic contacts to said filament and defining a bias current path in the filament transverse to said thickness dimension, the output bias electrode being formed at least partly as a finger extending towards the input bias electrode over part of said surface region as appropriate to achieve bias field concentration at and bias current convergence on said output bias electrode;
(2) applying a DC bias Voltage across said input and output bias electrodes with a polarity appropriate to produce minority carrier drift towards the output bias electrode; and
(3) detecting bias current produced in response to said bias voltage and radiation from said scene.

12. A method according to claim 11 wherein bias current is detected in step (3) by means of a voltage contact arranged on said surface region adjacent said output bias contact.

13. A method of detecting electromagnetic radiation including the steps of:
(1) arranging a photoconductive detector to receive radiation from a scene, the detector having:
(a) a sheet of semiconductor material of single conductivity type with a surface region transverse to its thickness dimension for receiving said radiation, and
(b) biasing means comprising Ohmic contacts to said sheet arranged for establishing a bias current direction transverse to said thickness dimension, said contacts being an input bias contact to bias a first side of the sheet and a plurality of output bias contacts arranged to bias a second side of the sheet remote from the first side, the output bias contacts being arranged as separate fingers extending over said surface region towards said input bias contact as appropriate to effect bias field concentration at and bias current convergence on each said finger;
(2) applying a DC bias voltage across said input and output bias electrodes with a polarity appropriate to produce minority carrier drift towards the output bias electrode; and
(3) detecting bias current produced in response to said bias voltage and radiation from said scene.

14. A method of detecting electromagnetic radiation including the steps of:

(1) arranging a photoconductive detector to receive radiation from a scene, the detector having:
  (a) a strip filament of semiconductor material of single conductivity type with a surface region transverse to its thickness dimension arranged for receiving said radiation, and
  (b) an input bias electrode and an output bias electrode forming Ohmic contacts to said filament and defining a bias current path in the filament transverse to said thickness dimension, the filament cross-section being reduced immediately adjacent said output bias electrode to constrict said bias current path and produce bias field concentration at and bias current convergence on said output bias electrode;
(2) applying a DC bias voltage across said input and output bias electrodes with a polarity appropriate to produce minority carrier drift towards the output bias electrode; and
(3) detecting bias current produced in response to said bias voltage and radiation from said scene.

15. A method according to claim 14 wherein said cross-section is reduced by any one of tapering and notching said filament immediately adjacent said output bias electrode.

16. A method of detecting electromagnetic radiation including the steps of:
(1) arranging a photoconductive detector to receive radiation from a scene, the detector having:
  (a) a semiconductor material element with a surface arranged to receive said radiation and bearing an input bias electrode and an output bias electrode, forming Ohmic contacts thereto, the input bias electrode being annular and the output bias electrode being a spot arranged centrally thereof as appropriate to establish a radial bias field concentrating towards and bias current converging on the output bias electrode;
(2) applying a DC bias voltage across said input and output bias electrodes with a polarity appropriate to produce minority carrier drift towards the output bias electrode; and
(3) detecting bias current produced in response to said voltage and radiation from said scene.

* * * * *